(12) United States Patent
Kang et al.

(10) Patent No.: US 12,021,020 B2
(45) Date of Patent: Jun. 25, 2024

(54) SEMICONDUCTOR PACKAGE

(71) Applicant: SAMSUNG ELECTRONICS CO., LTD., Suwon-si (KR)

(72) Inventors: Myungsam Kang, Hwaseong-si (KR); Youngchan Ko, Seoul (KR); Jeongseok Kim, Cheonan-si (KR); Bongju Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 306 days.

(21) Appl. No.: 17/149,216

(22) Filed: Jan. 14, 2021

(65) Prior Publication Data
US 2022/0013454 A1 Jan. 13, 2022

(30) Foreign Application Priority Data
Jul. 10, 2020 (KR) .................. 10-2020-0085231

(51) Int. Cl.
*H01L 23/28* (2006.01)
*H01L 23/00* (2006.01)
(Continued)

(52) U.S. Cl.
CPC .......... *H01L 23/5226* (2013.01); *H01L 23/28* (2013.01); *H01L 23/3128* (2013.01);
(Continued)

(58) Field of Classification Search
CPC ................ H01L 23/28; H01L 23/3128; H01L 23/49816; H01L 23/49822; H01L 23/49833; H01L 24/02
See application file for complete search history.

(56) References Cited

U.S. PATENT DOCUMENTS 5,353,498 A * 10/1994 Fillion .................. H01L 23/293
257/E23.092
6,281,450 B1 * 8/2001 Urasaki .................. H01L 24/32
361/767
(Continued)

FOREIGN PATENT DOCUMENTS

| KR | 101504899 B1 | 3/2015 |
| KR | 101858954 B1 | 6/2018 |
| KR | 102036762 B1 | 10/2019 |

*Primary Examiner* — Phat X Cao
(74) *Attorney, Agent, or Firm* — Fish & Richardson P.C.

(57) ABSTRACT

A semiconductor package includes: a first redistribution structure having a first surface and a second surface opposing the first surface, and including a first insulating layer and a first redistribution layer disposed on the first insulating layer; a semiconductor chip disposed on the first surface of the first redistribution structure, and including a connection pad electrically connected to the first redistribution layer and embedded in the first insulating layer; a vertical connection structure disposed on the first surface and electrically connected to the first redistribution layer; an encapsulant encapsulating at least a portion of each of the semiconductor chip and the vertical connection structure; a second redistribution structure disposed on the encapsulant and including a second redistribution layer electrically connected to the vertical connection structure; and a connection bump disposed on the second surface and electrically connected to the first redistribution layer.

20 Claims, 20 Drawing Sheets

(51) Int. Cl.
    *H01L 23/31*     (2006.01)
    *H01L 23/522*    (2006.01)
    *H01L 23/528*    (2006.01)
    *H01L 23/532*    (2006.01)

(52) U.S. Cl.
    CPC ...... *H01L 23/528* (2013.01); *H01L 23/53238* (2013.01); *H01L 24/14* (2013.01)

(56) References Cited

U.S. PATENT DOCUMENTS

| | | | |
|---|---|---|---|
| 7,923,295 B2* | 4/2011 | Shim | H01L 21/6835 |
| | | | 257/737 |
| 10,224,254 B2 | 3/2019 | Chen et al. | |
| 10,607,940 B2 | 3/2020 | Sugiyama et al. | |
| 11,482,491 B2* | 10/2022 | Chen | H01L 23/5389 |
| 11,508,633 B2* | 11/2022 | Kuo | H01L 21/561 |
| 2011/0304058 A1* | 12/2011 | Pendse | H05K 3/3452 |
| | | | 438/126 |
| 2016/0105960 A1* | 4/2016 | Sakamoto | H01L 23/5383 |
| | | | 174/262 |
| 2018/0076122 A1 | 3/2018 | Lu et al. | |
| 2018/0261535 A1 | 9/2018 | Lin et al. | |
| 2018/0277394 A1 | 9/2018 | Huemoeller et al. | |
| 2019/0189600 A1* | 6/2019 | Lim | H01L 23/49811 |
| 2020/0083201 A1* | 3/2020 | Suk | H01L 24/09 |
| 2020/0168565 A1* | 5/2020 | Myung | H01L 23/564 |
| 2021/0375809 A1* | 12/2021 | Liang | H01L 23/5386 |

\* cited by examiner

SEMICONDUCTOR PACKAGE

CROSS-REFERENCE TO THE RELATED APPLICATION

This application claims benefit of priority to Korean Patent Application No. 10-2020-0085231 filed on Jul. 10, 2020 in the Korean Intellectual Property Office, the disclosure of which is incorporated herein by reference in its entirety.

BACKGROUND

Example embodiments of the present disclosure relate to a semiconductor package and a method of manufacturing a semiconductor package.

Recently, as a semiconductor chip has been designed to have a reduced size, a semiconductor package in which a redistribution layer has a fine pitch and high design flexibility has been necessary. Also, with high performance of a semiconductor chip, a semiconductor package having improved stiffness and heat dissipation properties has been necessary.

SUMMARY

According to example embodiment of the present disclosure, a semiconductor package in which a redistribution layer has high design flexibility and a method of manufacturing the semiconductor package is provided.

According to an example embodiment of the present disclosure, a semiconductor package is provided. The semiconductor package includes: a first redistribution structure having a first surface and a second surface opposing the first surface, and including a first insulating layer and a first redistribution layer disposed on the first insulating layer; a semiconductor chip disposed on the first surface of the first redistribution structure, and including a connection pad electrically connected to the first redistribution layer and embedded in the first insulating layer; a vertical connection structure disposed on the first surface of the first redistribution structure and electrically connected to the first redistribution layer; an encapsulant encapsulating at least a portion of each of the semiconductor chip and the vertical connection structure; a second redistribution structure disposed on the encapsulant and including a second redistribution layer electrically connected to the vertical connection structure; and a connection bump disposed on the second surface of the first redistribution structure and electrically connected to the first redistribution layer, wherein the vertical connection structure includes a pattern layer embedded in the first insulating layer, a barrier layer disposed on the pattern layer, and a pillar layer disposed on the barrier layer, and wherein the pattern layer is disposed on a same level as a level of the connection pad.

According to an example embodiment of the present disclosure, a semiconductor package is provided. The semiconductor package includes: a redistribution structure including an insulating layer and a redistribution layer disposed on the insulating layer; a semiconductor chip disposed on the redistribution structure and including a connection pad electrically connected to the redistribution layer; and a vertical connection structure surrounding the semiconductor chip and electrically connected to the redistribution layer on the redistribution structure, wherein the vertical connection structure includes a pattern layer embedded in a surface, opposite to a surface of the insulating layer on which the redistribution layer is disposed, a barrier layer disposed on the pattern layer, and a pillar layer disposed on the barrier layer, and wherein the pattern layer has a first pad portion in contact with a lower surface of the barrier layer and overlapping the barrier layer, one end of a pattern portion extending from the first pad portion in a horizontal direction, and a second pad portion connected to another end of the pattern portion.

According to an example embodiment of the present disclosure, a semiconductor package is provided. The semiconductor package includes: a redistribution structure including an insulating layer and a redistribution layer disposed on the insulating layer; a semiconductor chip disposed on the redistribution structure and including a connection pad electrically connected to the redistribution layer; a vertical connection structure disposed on the redistribution structure and surrounding the semiconductor chip; and an encapsulant encapsulating at least a portion of each of the semiconductor chip and the vertical connection structure, wherein the vertical connection structure includes a pattern layer embedded in the insulating layer, a barrier layer disposed on the pattern layer, and a pillar layer disposed on the barrier layer, and at least a portion of an upper surface of the pattern layer is in contact with the encapsulant, and at least a portion of each of a side surface and a lower surface of the pattern layer is in contact with the insulating layer, and wherein the redistribution structure further includes a first redistribution via penetrating the insulating layer, that is in contact with the lower surface of the pattern layer, and connecting the redistribution layer to the pattern layer.

According to an example embodiment of the present disclosure, a method of manufacturing a semiconductor package is provided. The method includes: preparing a metal plate including a first metal layer, an etching barrier layer on the first metal layer, and a second metal layer on the etching barrier layer; forming a pattern layer by etching the first metal layer; disposing the metal plate on a tape carrier including an adhesive layer, such that the pattern layer is embedded in the adhesive layer; forming a pillar layer corresponding to the pattern layer by etching the second metal layer; forming a barrier layer between the pattern layer and the pillar layer by etching the etching barrier layer; disposing a semiconductor chip on the tape carrier such that a connection pad of the semiconductor chip is buried in the adhesive layer; forming an encapsulant encapsulating each of the semiconductor chip, the pillar layer, and the barrier layer; removing the tape carrier and forming an insulating layer covering the pattern layer and the connection pad; and forming a redistribution layer electrically connected to the pattern layer and the connection pad on the insulating layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

It will be understood that when an element, component, layer, pattern, structure, region, or so on (hereinafter collectively "element") of a semiconductor device is referred to as being "over," "above," "on," "below," "under," "beneath," "connected to" or "coupled to" another element of the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Hereinafter, embodiments of the present disclosure will be described as follows with reference to the accompanying drawings.

Figure 1A:
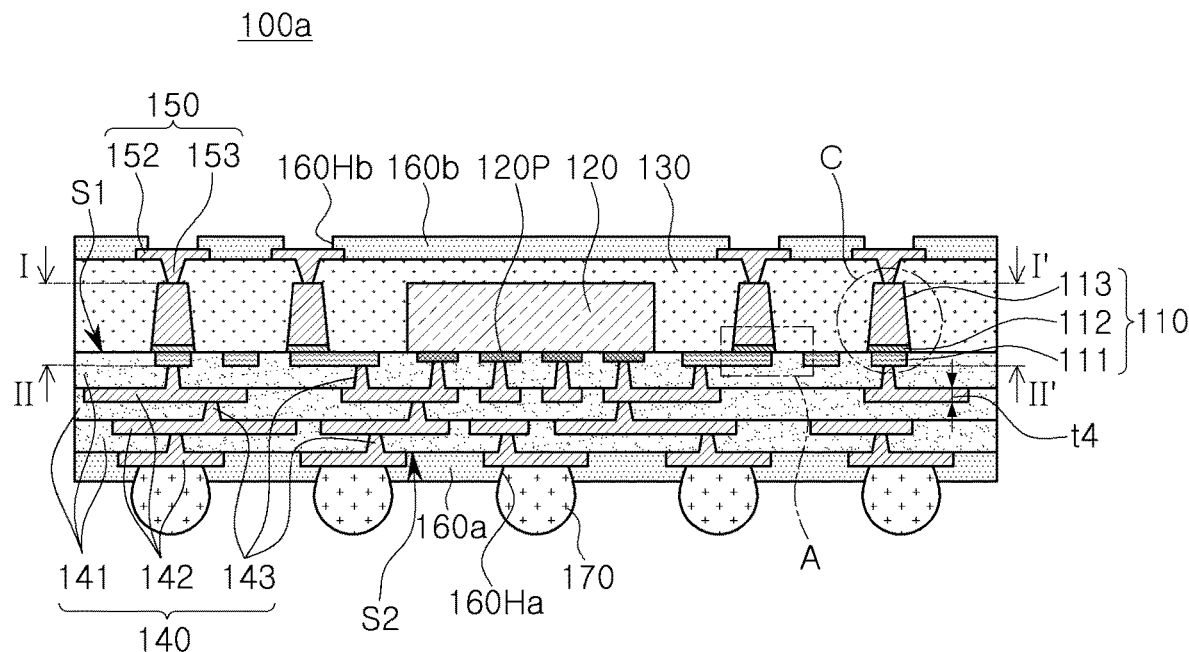
FIG. 1A is a cross-sectional diagram illustrating a semiconductor package according to an example embodiment of the present disclosure.
Figure 1B:
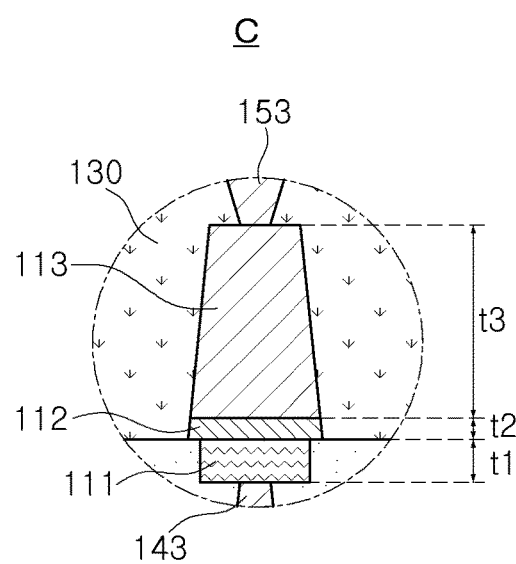
FIG. 1B is a cross-sectional diagram illustrating a region "C" illustrated in FIG. 1 according to an example embodiment of the present disclosure.
Figure 2A:
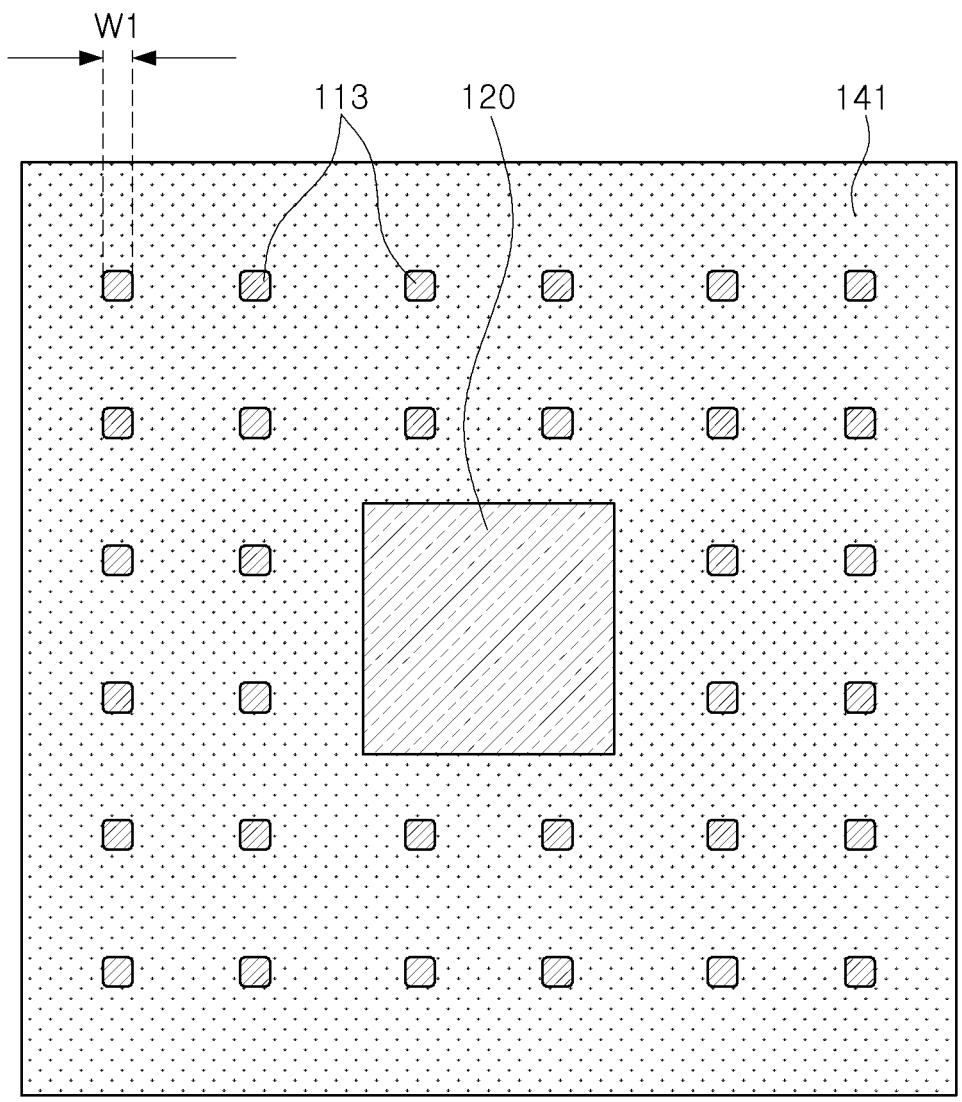
FIG. 2A is a plan cross-sectional diagram illustrating the semiconductor package illustrated in FIG. 1 taken along lines I-I'.
Figure 2B:
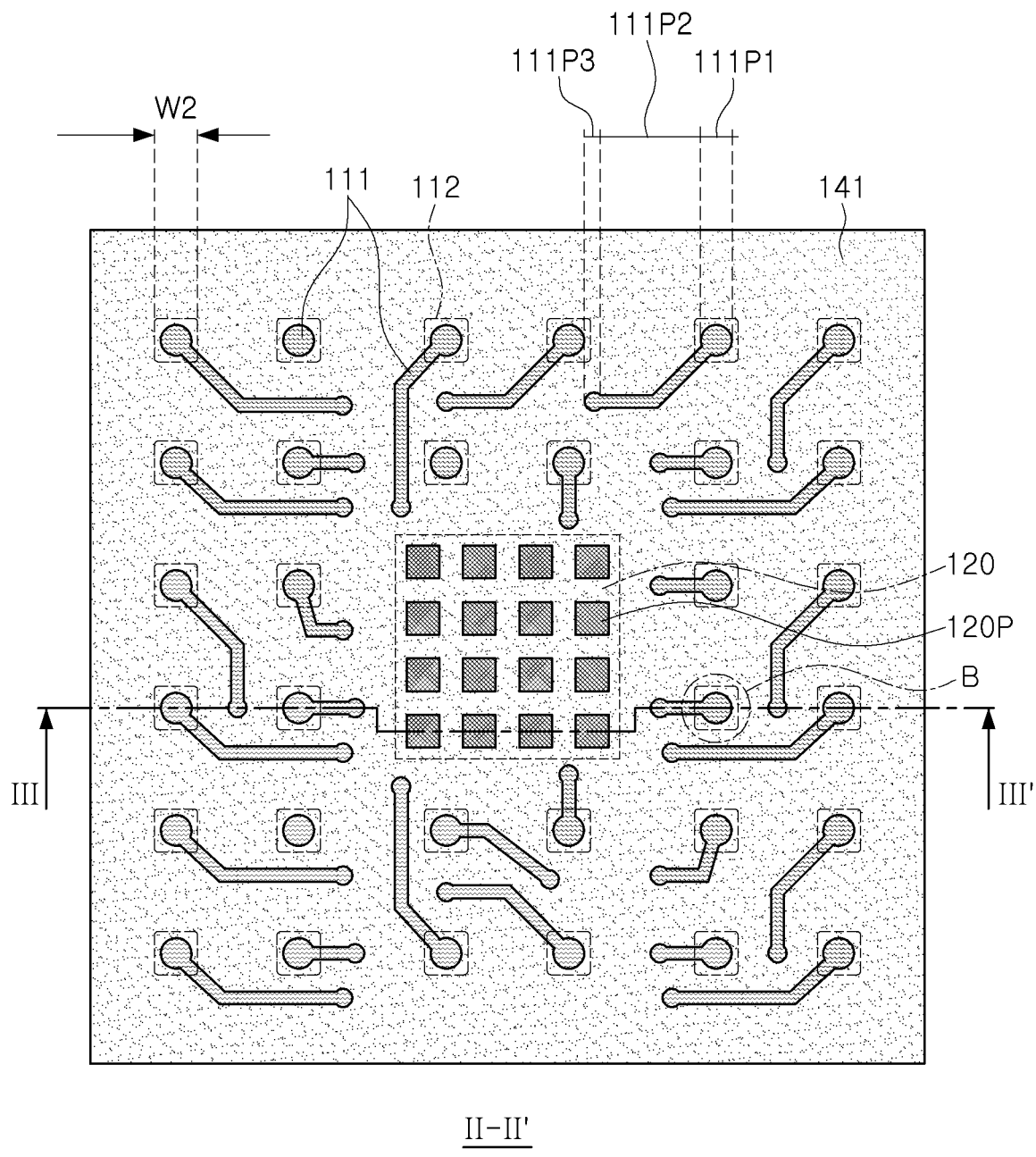
FIG. 2B is a plan cross-sectional diagram illustrating the semiconductor package illustrated in FIG. 1 taken along lines II-II'.

FIG. 1A is a cross-sectional diagram illustrating a semiconductor package 100a according to an example embodiment. FIG. 1B is a cross-sectional diagram illustrating a region "C" illustrated in FIG. 1. FIGS. 2A and 2B are plan cross-sectional diagrams illustrating the semiconductor package 100a illustrated in FIG. 1 taken along lines I-I' and II-II'. FIG. 1 is a vertical cross-sectional diagram taken along line in FIG. 2B.

Referring to FIGS. 1A, 1B, 2A, and 2B, the semiconductor package 100a may include a vertical connection structure 110, a semiconductor chip 120, an encapsulant 130, a first redistribution structure 140, and a second redistribution structure 150. Also, the semiconductor package 100a may further include a first passivation layer, 160a, a second passivation layer 160b, and a plurality of a connection bump 170.

The vertical connection structure 110 may be disposed on a first surface S1 of the first redistribution structure 140, and may be electrically connected to the first redistribution layers 142. The vertical connection structure 110 may be disposed to surround the semiconductor chip 120 on the first surface S1. The vertical connection structure 110 may provide an electrical connection path for connecting the elements of the semiconductor package 100a disposed in upper and lower portions. The vertical connection structure 110 may be connected to a first redistribution via 143 of the first redistribution structure 140 and a second redistribution via 153 of the second redistribution structure 150. A package-on-package structure in which another package is combined with the upper portion of the semiconductor package 100a may be implemented by the vertical connection structure 110.

The vertical connection structure 110 may include a pattern layer 111 embedded in the first insulating layer 141 of the first redistribution structure 140, a barrier layer 112 disposed on the pattern layer 111, and a pillar layer 113 disposed on the barrier layer 112. The pattern layer 111, the barrier layer 112, and the pillar layer 113 may include a metal material such as copper (Cu), aluminum (Al), silver (Ag), tin (Sn), gold (Au), Nickel (Ni), lead (Pb), titanium (Ti), or alloys thereof.

The pattern layer 111 may be embedded in the first surface S1 of the first redistribution structure 140. The pattern layer 111 may be disposed on substantially the same level as a level of the connection pad 120P of the semiconductor chip 120. At least a portion of an upper surface of the pattern layer 111 may be exposed from the first insulating layer 141.

The pattern layer 111 may have a vertical cross-sectional shape of which a side surface is tapered, such that a width increases towards the barrier layer 112.

Referring to FIG. 2B, the pattern layer 111 may include a first pad portion 111P1 in contact with the lower surface of the barrier layer 112, a pattern portion 111P2 extending from one end of the first pad portion 111P1 in a horizontal direction, and a second pad portion 111P3 connected to the other end of the pattern portion 111P2. In the plan diagram, the first pad portion 111P1 may be disposed to overlap the barrier layer 112 in a direction perpendicular to a lower surface or an upper surface of the barrier layer 112. The pattern portion 111P2 may have a lane shape that connects the first pad portion 111P1 to the second pad portion 111P3, and at least a portion of the pattern portion 111P2 may be directly in contact with the lower surface of the barrier layer 112.

The barrier layer 112 may be disposed on the upper surface of the pattern layer 111. The lower surface of the barrier layer 112 may be substantially coplanar with the lower surface of the encapsulant 130. Referring to FIG. 1B, the thickness t2 of the barrier layer 112 may be smaller than the thickness t1 of the pattern layer 111 and the thickness t3 of the pillar layer 113. The barrier layer 112 may have a vertical cross-sectional shape of which a side surface is tapered, such that a width increases towards the pattern layer 111. A side surface of the barrier layer 112 may not be continuously connected to the side surface of the pillar layer 113. The barrier layer 112 may include a material different from materials of the pillar layer 113 and the pattern layer 111. For example, the barrier layer 112 may be a metal layer including nickel (Ni) or titanium (Ti), and the pillar layer 113 and/or the pattern layer 111 may be a metal layer including copper (Cu). The barrier layer 112 may work as an etching barrier in an etching process for forming the pattern layer 111 and the pillar layer 113.

The pillar layer 113 may be disposed on the upper surface of the barrier layer 112. The pillar layer 113 may be a top portion of the vertical connection structure 110 and may provide an electrical connection path penetrating the encapsulant 130. The pillar layer 113 may have a vertical cross-sectional shape of which a side surface is tapered, such that a width increases towards the barrier layer 112. For example, a width of the upper surface of the pillar layer 113 ("W1" in FIG. 2A) may be smaller than a width of the lower surface of the pillar layer 113 ("W2" in FIG. 2B). "W2" in FIG. 2B corresponds to the width of the lower surface of the barrier layer 112, but may be substantially similar to the width of the lower surface of the pillar layer 113.

A thickness of the pillar layer 113 may be greater than a thickness of the pattern layer 111 and a thickness of the barrier layer 112, and a thickness of the pattern layer 111 may be greater than a thickness of the barrier layer 112. For example, a thickness t3 of the pillar layer 113 may range from about 200 μm to about 100 μm, a thickness t2 of the barrier layer 112 may range from about 1 μm to about 2 μm, and a thickness of t1 of the pattern layer 111 may range from about 5 μm to about 10 μm. Also, the thickness t1 of the pattern layer 111 may be substantially similar to the thickness t4 of the first redistribution layer 142, but an example embodiment thereof is not limited thereto. The thickness t1 of the pattern layer 111 may be larger or smaller than the thickness t4 of the first redistribution layer 142. As the pattern layer 111, the barrier layer 112, and the pillar layer 113 are formed by an etching process, each of the pattern layer 111, the barrier layer 112, and the pillar layer 113 may have a vertically concave cross-sectional shape. At least a portion of each of a side surface of the pillar layer 113, a side surface of the barrier layer 112, and an upper surface of the pattern layer 111 may be directly in contact with the encapsulant 130.

As the pattern layer 111 is directly formed below the barrier layer 112, the pattern layer 111 may be disposed on substantially the same level as a level of the connection pad 120P of the semiconductor chip 120, and may be disposed on a level higher than a level of the first redistribution layer 142. Accordingly, design flexibility of the first redistribution layer 142 may improve.

Figure 3A:
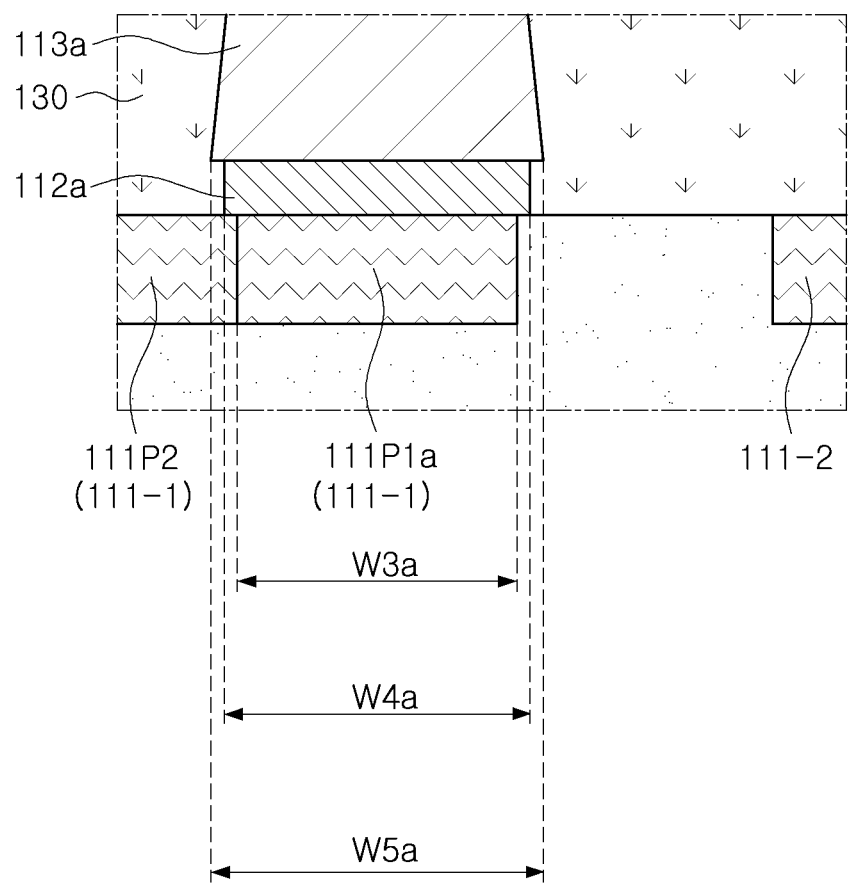
FIG. 3A is a cross-sectional diagram illustrating a first modified example of region "A" illustrated in FIG. 1, illustrating a portion of the region.
Figure 3B:
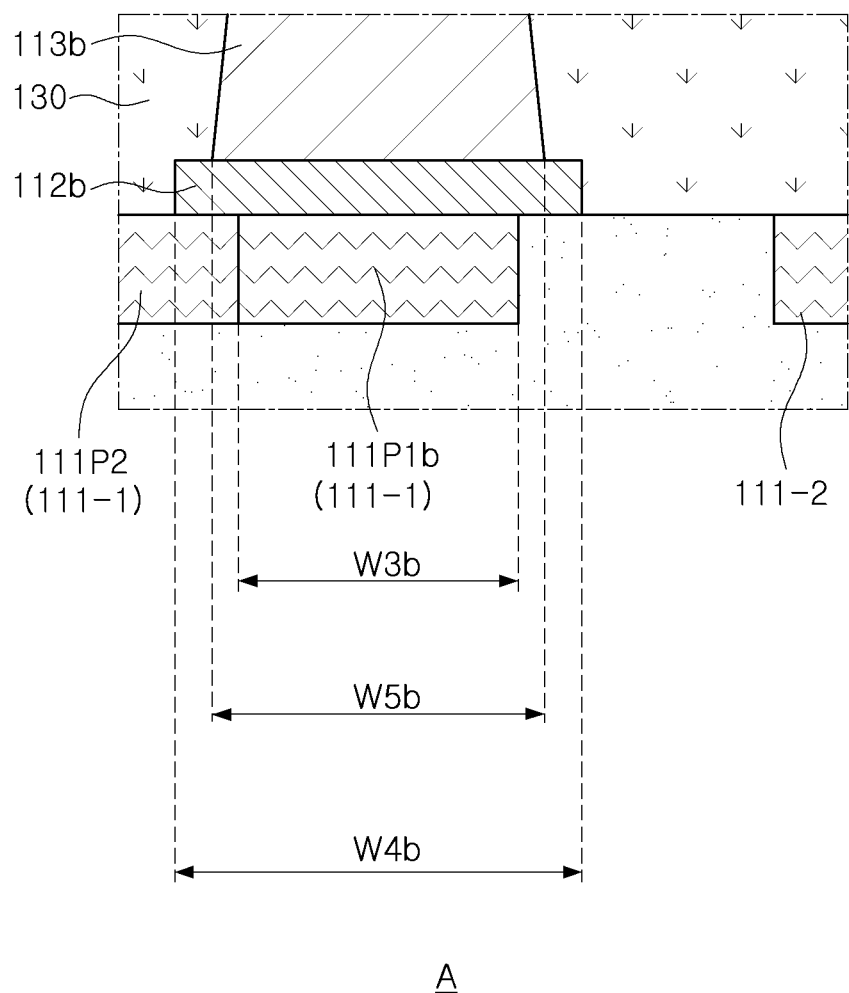
FIG. 3B is a cross-sectional diagram illustrating a second modified example of region "A" illustrated in FIG. 1, illustrating a portion of the region.

In the description below, modified examples of the vertical connection structure 110 will be described with reference to FIGS. 3A to 3B. FIGS. 3A to 3B are cross-sectional diagrams illustrating a modified example of region "A" of the semiconductor package 100a illustrated in FIG. 1, illustrating a portion of the region.

Referring to FIG. 3A, in a first modified example, a width W4a of a barrier layer 112a may be smaller than a width W5a of a pillar layer 113a, and may be greater than a width W3a of the first pad portion 111P1a of the pattern layer 111-1. The barrier layer 112a may be spaced apart from another pattern layer 111-2 adjacent to the pattern layer 111-1 formed therebelow. As the pillar layer 113a, the barrier layer 112a, the first pad portion 111P1a, and the pattern portion 111P2 are formed by an etching process, a side surface of each of the pillar layer 113a, the barrier layer 112a, the first pad portion 111P1a, and the pattern portion 111P2 may have a rounded shape.

Referring to FIG. 3B, in a second modified example, a width W4b of the barrier layer 112b may be greater than the width W5b of the pillar layer 113b and a width W3b of the first pad portion 111P1b of the pattern layer 111-1. The barrier layer 112b may be spaced apart from the other pattern layer 111-2 adjacent to the pattern layer 111-1 formed therebelow. A side surface of each of the pillar layer 113b, the barrier layer 112b, the first pad portion 111P1b, and the pattern portion 111P2 may have a rounded shape.

Figure 4A:
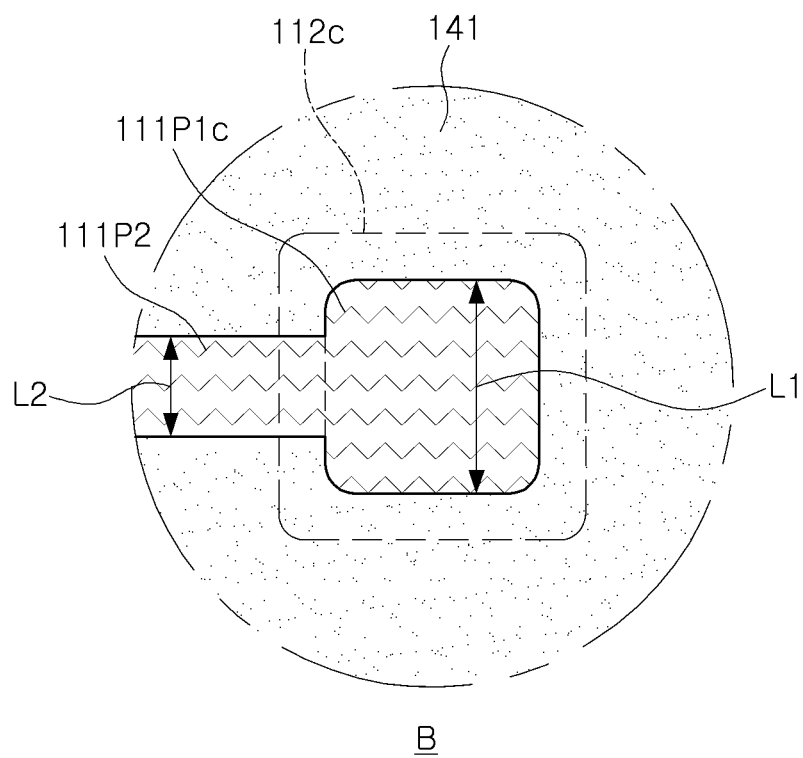
FIG. 4A is a cross-sectional diagram illustrating a first modified example of region "B" illustrated in FIG. 1, illustrating a portion of the region.
Figure 4B:
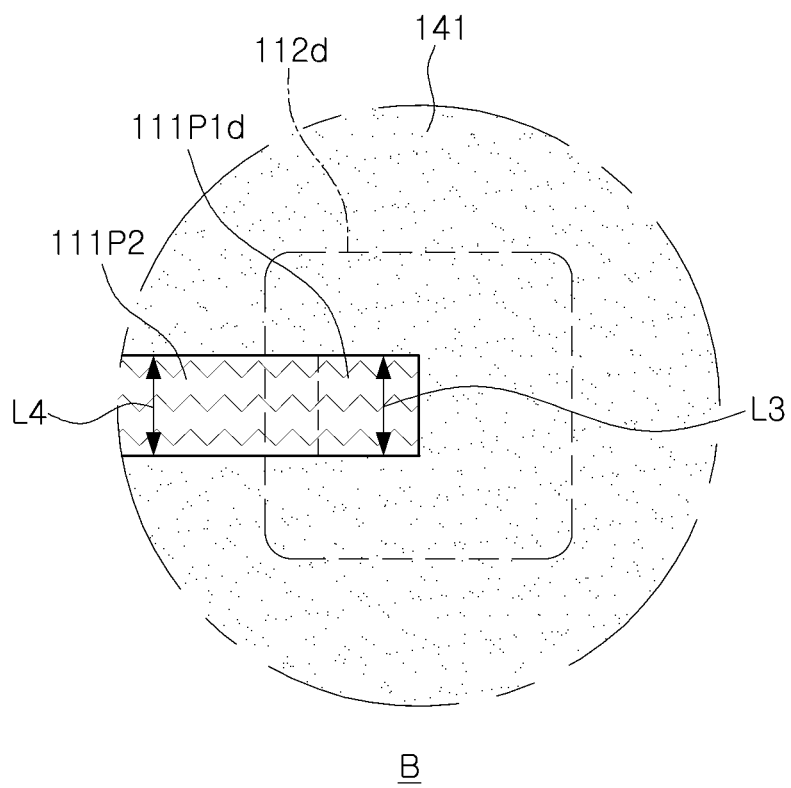
FIG. 4B is a cross-sectional diagram illustrating a second modified example of region "B" illustrated in FIG. 1, illustrating a portion of the region.
Figure 4C:
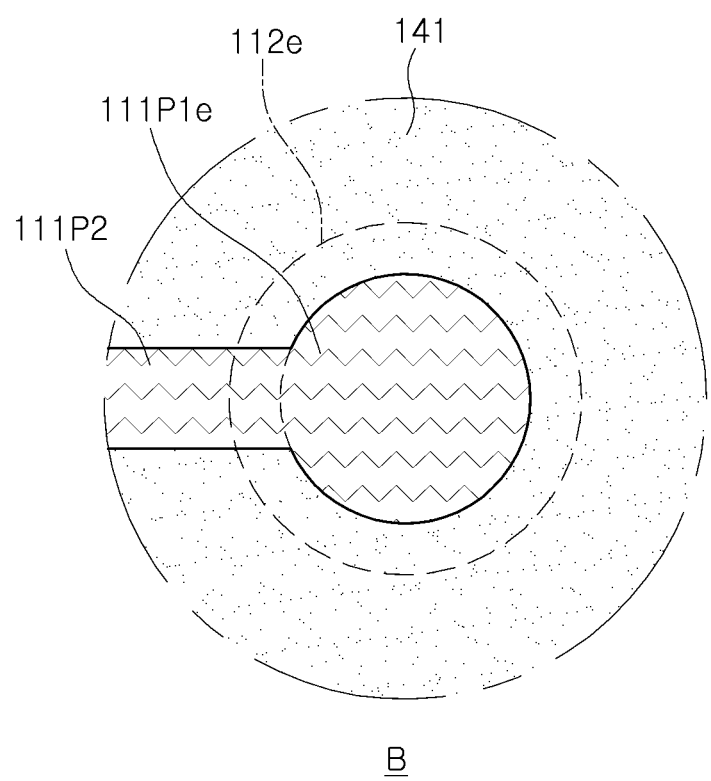
FIG. 4C is a cross-sectional diagram illustrating a third modified example of region "B" illustrated in FIG. 1, illustrating a portion of the region

In the description below, other modified examples of the vertical connection structure 110 will be described with reference to FIGS. 4A to 4C. FIGS. 4A to 4C are cross-sectional diagrams illustrating modified examples of region "B" of the semiconductor package 100a illustrated in FIG. 1, illustrating a portion of the region.

Referring to FIG. 4A, in a first modified example, a first pad portion 111P1c may have a rectangular planar shape, similarly to a barrier layer 112c. Each of the first pad portion 111P1c and the barrier layer 112c may have a rounded vertex. The pattern portion 111P2 may extend from one end of the first pad portion 111P1c. A width L1 of the first pad portion 111P1c parallel to a line width L2 of the pattern portion 111P2 may be larger than a line width L2 of the pattern portion 111P2. At least a portion of the pattern portion 111P2 may be disposed to overlap the barrier layer 112c.

Referring to FIG. 4B, in a second modified example, the first pad portion 111P1d may have a shape extending from one end of the pattern portion 111P2 with a line width L3 substantially the same as a line width L4 of the pattern portion 111P2. The first pad portion 111P1d may have the same lane shape as that of the pattern portion 111P2. The first pad portion 111P1d and the pattern portion 111P2 may have a shape in which a boundary there between is not substantially distinct.

Referring to FIG. 4C, in a third modified example, the first pad portion 111P1e may have a circular planar shape similarly to the barrier layer 112e. The pattern portion 111P2 may extend from one end of the first pad portion 111P1e and may be disposed to partially overlap the barrier layer 112e.

Referring to FIG. 1, the semiconductor chip 120 may be disposed on the first surface S1 of the first redistribution structure 140, may include a connection pad 120P electrically connected to the first redistribution layer 142 and embedded in the first insulating layer 141. The semiconductor chip 120 may be implemented as a bare integrated circuit (IC) in which a separate bump or wiring layer is not formed, but an example embodiment thereof is not limited thereto, and the semiconductor chip 120 may be implemented by a packaged type integrated circuit. The integrated circuit may be formed on the basis of an active wafer. The semiconductor chip 120 may include silicon (Si), germanium (Ge), or gallium arsenide (GaAs), and various types of integrated circuits may be formed therein. The integrated circuit may include processors such as a central processor (e.g., CPU), a graphics processor (e.g., GPU), a field programmable gate array (FPGA), an application processor (AP), a digital signal processor, an encryption processor, a microprocessor, a microcontroller, or the like, but an example embodiment thereof is not limited thereto, and may be implemented by a logic chip such as an analog-digital converter and an application-specific IC (ASIC), or a memory chip such as a volatile memory (e.g., DRAM) and a non-volatile memory (e.g., a ROM and a flash memory). The connection pad 120P may electrically connect the semiconductor chip 120 to the other elements. The connection pad 120P may include a metal material, such as aluminum (Al), for example, but an example embodiment thereof is not limited thereto, and the connection pad 120P may include different types of conductive materials.

The encapsulant 130 may seal at least a portion of each of the semiconductor chip 120 and the vertical connection structure 110. The encapsulant 130 may cover at least a portion of each of a side surface of the pillar layer 113, a side surface of the barrier layer 112, and an upper surface of the pattern layer 111. The lower surface of the encapsulant 130 may be substantially coplanar with an active surface of the semiconductor chip 120 on which the connection pad 120P is disposed and the lower surface of the barrier layer 112. The encapsulant 130 may include, for example, a thermosetting resin such as an epoxy resin, a thermoplastic resin such as polyimide, or a prepreg including an inorganic filler or/and glass fiber, an Ajinomoto Build-up Film (ABF), FR-4, bismaleimide triazine (BT), or an epoxy molding compound (EMC).

The first redistribution structure 140 may have a first surface S1 and a second surface S2 opposing the first surface S1, and may include the first insulating layer 141 and the first redistribution layer 142 disposed on the first insulating layer 141. The first redistribution structure 140 may redistribute a plurality of the connection pad 120P of the semiconductor chip 120, and may include a larger or smaller number of the first insulating layer 141, the first redistribution layer 142, and the first redistribution via 143 than examples illustrated in the diagrams.

The first insulating layer 141 may include an insulating material. For example, the first insulating layer 141 may include a photosensitive insulating material such as a photosensitive imageable dielectric (PID). In this case, a fine pitch may be implemented by a photolithography process such that the plurality of the connection pad 120P of the semiconductor chip 120 may be effectively redistributed. The insulating material included in the first insulating layer 141 is not limited thereto, and other types of insulating materials may be included. The first insulating layer 141 may include the same insulating material as that of the encapsulant 130 or may include a different type of insulating material. A plurality of the first insulating layer 141 may be disposed on different levels of the first redistribution structure 140. The uppermost insulating layer of the plurality of the insulating layer 141 may cover a lower surface and side surfaces of the pattern layer 111. The uppermost insulating layer of the plurality of the insulating layer 141 may cover the lower surface and side surfaces of the connection pad 120P.

The first redistribution layer 142 may be formed on a side of the first insulating layer 141 opposite to a surface of the first insulating layer 141 in which the pattern layer 111 is embedded. The first redistribution layer 142 may include a metal material such as copper (Cu), aluminum (Al), silver (Ag), tin (Sn), gold (Au), nickel (Ni), lead (Pb), Titanium (Ti), or alloys thereof, for example. The first redistribution layer 142 may perform various functions according to design. For example, the first redistribution layer 142 may include a ground (GND) pattern, a power (PWR) pattern, and a signal (Signal, S) pattern. The signal S pattern may transfer various signals other than the ground (GND) pattern and the power (PWR) pattern, such as data signals. A thickness t4 of the first redistribution layer 142 may be substantially similar to a thickness t1 of the pattern layer 111, but an example embodiment thereof is not limited thereto. The thickness t4 of the first redistribution layer 142 may be greater or smaller than the thickness t1 of the pattern layer 111.

The first redistribution via 143 may penetrate a portion of the first insulating layer 141 in contact with a lower surface of the pattern layer 111 and may physically and/or electrically connect the first redistribution layer 142 to the connection pad 120P and the pattern layer 111. The first redistribution via 143 may electrically connect the vertical connection structure 110 to at least one of the signal pattern and the power pattern of the first redistribution layer 142. The first redistribution via 143 may include a metal material, such as copper (Cu), aluminum (Al), silver (Ag), tin (Sn), gold (Au), nickel (Ni), lead (Pb), titanium (Ti), or alloys thereof, for example. The first redistribution via 143 may be a filled via completely filled with a metallic material, or a conformal via in which a metallic material is disposed along a wall surface of the via hole. The first redistribution via 143 may have a tapered side surface, an hourglass shape, or a cylindrical shape. The first redistribution via 143 may be integrated with the first redistribution layer 142, but an example embodiment thereof is not limited thereto.

The second redistribution structure 150 may include a second redistribution layer 152 disposed on the encapsulant 130 and electrically connected to the vertical connection structure 110, and a second redistribution via 153 penetrating a portion of the encapsulant 130 covering an upper surface of the vertical connection structure 110 and connecting the second redistribution layer 152 to the vertical connection structure 110.

At least a portion of the second redistribution layer 152 may be exposed on an upper portion of the semiconductor package 100a, and may be physically and electrically coupled to other electronic components provided externally of the semiconductor package 100a. The second redistribution layer 152 may include a metal material such as copper (Cu), aluminum (Al), silver (Ag), tin (Sn), gold (Au), nickel (Ni), lead (Pb), Titanium (Ti), or alloys thereof, for example.

The second redistribution via 153 may electrically connect the second redistribution layer 152 to the vertical connection structure 110. The second redistribution via 153 may include a metal material similar to that of the second redistribution layer 152. The second redistribution via 153 may be a filled via or a conformal via. The second redistribution via 153 may have a shape similar to a shape of the first redistribution via 143.

The passivation layers of the semiconductor package 100a may include the first passivation layer 160a disposed on the second surface S2 of the first redistribution structure 140 and the second passivation layer 160b disposed on the second redistribution structure 150. Each of the first passivation layer 160a and the second passivation layer 160b may have openings for exposing portions of the first redistribution layer 142 and the second redistribution layer 152. The first passivation layer 160a and the second passivation layer 160b may include an insulating material, such as ABF, for example, but an example embodiment thereof is not limited thereto and the first passivation layer 160a and the second passivation layer 160b may include other types of insulating materials.

The connection bump 170 may be disposed on the second surface S2 of the first redistribution structure 140 and may be connected to the first redistribution layer 142 exposed through the opening of the first passivation layer 160a. The connection bump 170 may physically and/or electrically connect the semiconductor package 100a to an external entity. The connection bump 170 may include a low melting point metal, such as tin (Sn) or an alloy (Sn—Ag—Cu) including tin (Sn), for example. The connection bump 170 may be configured as a land, a ball, or a pin. The connection bump 170 may include a copper pillar or solder. A plurality of the connection bump 170 may be provided and may be disposed in a fan-out region. The fan-out region may refer to a region which does not overlap the semiconductor chip 120 in a direction perpendicular to the first surface S1 or the second surface S2 of the first redistribution structure 140.

FIGS. 5A to 5G are cross-sectional diagrams illustrating a method of manufacturing a semiconductor package 100a illustrated in FIG. 1.

Figure 5A:
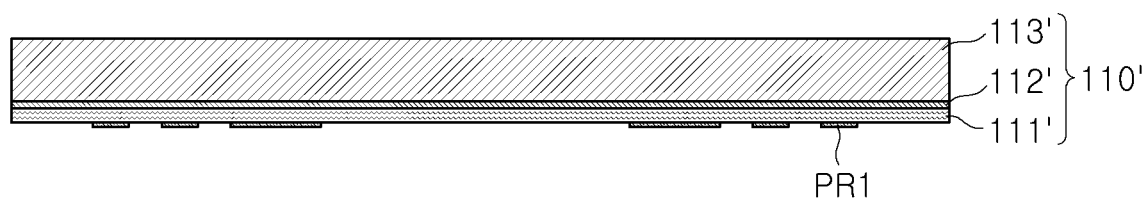
FIG. 5A is a first cross-sectional diagram illustrating a method of manufacturing a semiconductor package illustrated in FIG. 1.

Referring to FIG. 5A, firstly, metal plate 110' including a first metal layer 111', an etching barrier layer 112' on the first metal layer 111', and a second metal layer 113' on the etching barrier layer 112' may be prepared. A thickness of the second metal layer 113' may be about 100 μm or greater and about 200 μm or less, a thickness of the etching barrier layer 112' may be about 1 μm or greater and about 2 μm or less, and a thickness of the first metal layer 111' may be about 5 μm or greater and about 10 μm or less. A patterned first etching resist PR1 may be disposed on a lower surface of the first metal layer 111'. As the patterned first etching resist PR1, a photoresist may be used, for example. The first metal layer 111', the second metal layer 113', and the etching barrier layer 112' may include a metal material. The etching barrier layer 112' may include a metal material different from metal materials of the first metal layer 111' and the second metal layer 113'. For example, the first metal layer 111' and the second metal layer 113' may include copper, and the etching barrier layer 112' may include nickel or titanium.

Figure 5B:
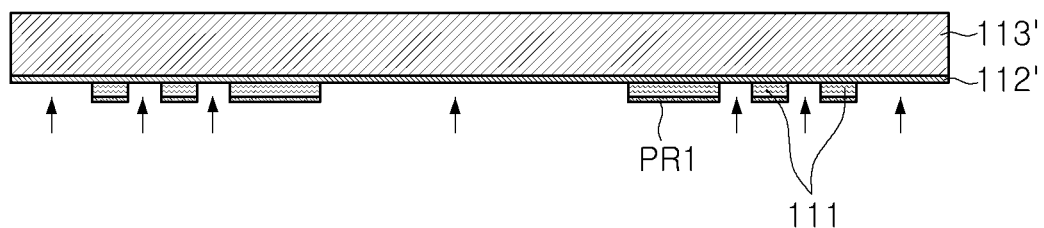
FIG. 5B is a second cross-sectional diagram illustrating the method of manufacturing the semiconductor package illustrated in FIG. 1.

Referring to FIG. 5B, the pattern layer 111 may be formed by etching the first metal layer 111' on which the patterned first etching resist PR1 is disposed. The first metal layer 111' may be etched using a copper chloride solution or an alkali solution. The etching barrier layer 112' may work as an etching stopper for an etching solution of the first metal layer 111'.

Figure 5C:
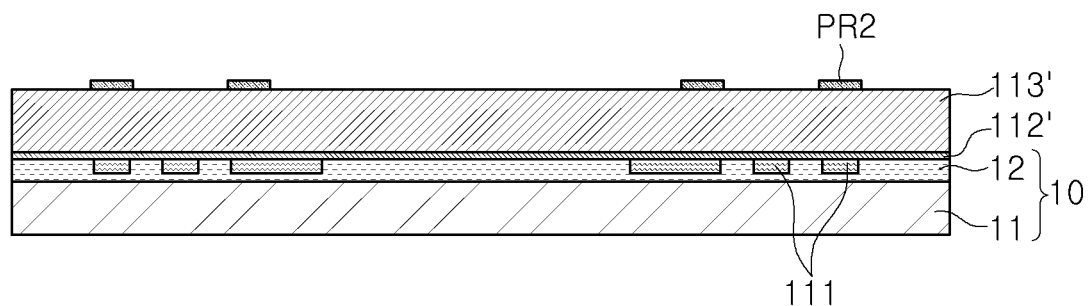
FIG. 5C is a third cross-sectional diagram illustrating the method of manufacturing the semiconductor package illustrated in FIG. 1.

Referring to FIG. 5C, the metal plate on which the pattern layer 111 is formed may be disposed on a tape carrier 10. The tape carrier 10 may include a carrier body 11 and an adhesive layer 12 on the carrier body 11. The adhesive layer 12 may include an organic material, but materials of the carrier body 11 and the adhesive layer 12 are not limited to any particular materials. The metal plate on which the pattern layer 111 is formed may be disposed on the tape carrier 10 such that the etching barrier layer 112' may face the adhesive layer 12 and the pattern layer 111 may be embedded in the adhesive layer 12. A patterned second etching resist PR2 may be disposed on an upper surface of the second metal layer 113' disposed on the opposite side of the adhesive layer 12.

Figure 5D:
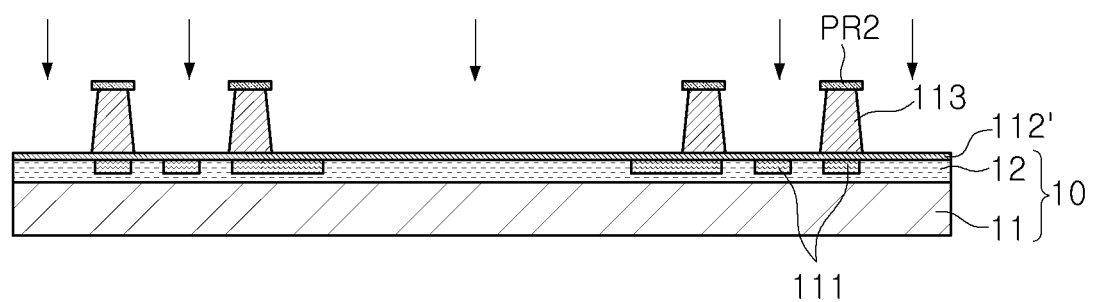
FIG. 5D is a fourth cross-sectional diagram illustrating the method of manufacturing the semiconductor package illustrated in FIG. 1.

Referring to FIG. 5D, the pillar layer 113 corresponding to the pattern layer 111 may be formed by etching the second metal layer 113' on which the patterned second etching resist PR2 is disposed. The second metal layer 113' may be etched using a copper chloride solution or an alkali solution. The second metal layer 113' may be etched by the same etching solution as the etching solution for etching the first metal layer 111'. The etching barrier layer 112' may work as an etching stopper for an etching solution of the second metal layer 113'. A side surface of the pillar layer 113 may be tapered, such that a horizontal width of the pillar layer 113 may increase towards the etching barrier layer 112'. A width of an upper surface of the pillar layer 113 may be smaller than a width of the second etching resist PR2. A side surface of the pillar layer 113 may be concavely rounded with respect to a central axis of the pillar layer 113.

Figure 5E:
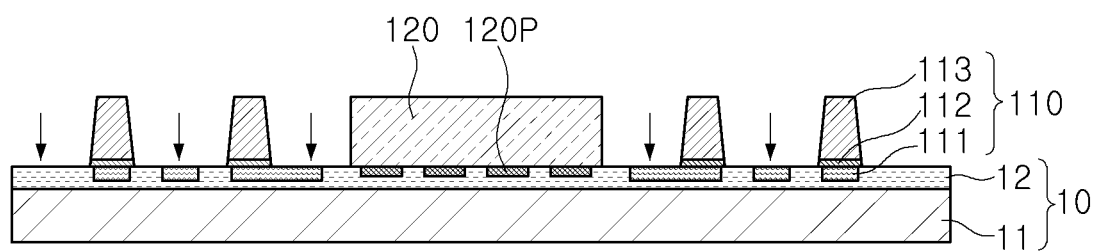
FIG. 5E is a fifth cross-sectional diagram illustrating the method of manufacturing the semiconductor package illustrated in FIG. 1.

Referring to FIG. 5E, the barrier layer 112 disposed between the pattern layer 111 and the pillar layer 113 may be formed by etching the etching barrier layer 112'. The etching barrier layer 112' may be etched by an etching solution different from the etching solution for etching the first metal layer 111' and the second metal layer 113'. The etching barrier layer 112' may be etched using nitric acid ($HNO_3$) or a potassium hydroxide (KOH) solution. A portion of the etching barrier layer 112' other than a portion covered by a lower portion of the pillar layer 113 may be removed. Accordingly, an upper surface of the adhesive layer 12 and an upper surface of the pattern layer 111 embedded in the adhesive layer 12 may be exposed.

The semiconductor chip 120 may be disposed on an upper surface of the tape carrier 10 from which the etching barrier layer 112' has been removed. The connection pad 120P of the semiconductor chip 120 may be embedded in the adhesive layer 12. A lower surface of the semiconductor chip 120 on which the connection pad 120P is disposed may be in contact with an upper surface of the adhesive layer 12.

Figure 5F:
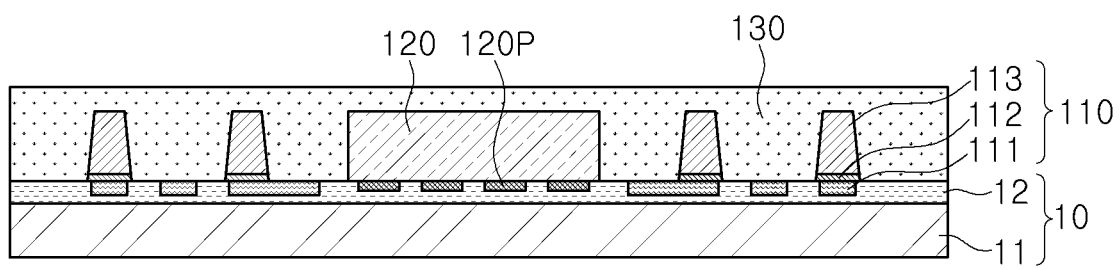
FIG. 5F is a sixth cross-sectional diagram illustrating the method of manufacturing the semiconductor package illustrated in FIG. 1.

Referring to FIG. 5F, an encapsulant 130 encapsulating each of the semiconductor chip 120, the pillar layer 113, and the barrier layer 112 may be formed. The encapsulant 130 may be in contact with an upper surface of the pattern layer 111 exposed from the adhesive layer 12. The lower surface of the encapsulant 130 may be coplanar with the lower surface of the barrier layer 112 and the lower surface of the semiconductor chip 120. The encapsulant 130 may include EMC.

Figure 5G:
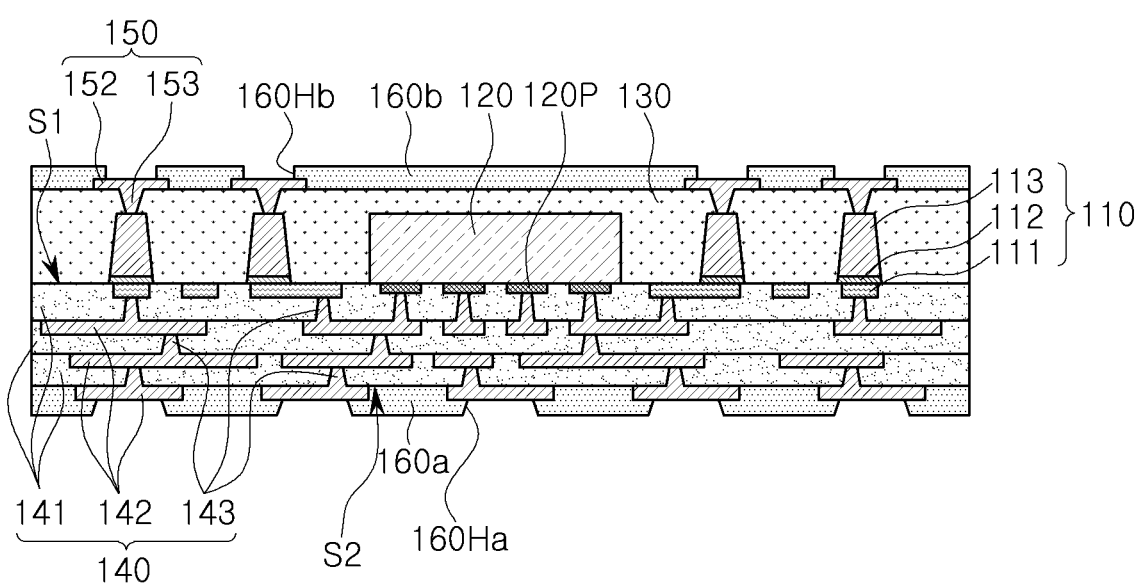
FIG. 5G is a seventh cross-sectional diagram illustrating the method of manufacturing the semiconductor package illustrated in FIG. 1.

Referring to FIG. 5G, the tape carrier 10 in FIG. 5F may be removed, and the first insulating layer 141 covering the pattern layer 111 and the connection pad 120P, the first redistribution layer 142 on the first insulating layer 141, and the first redistribution via 143 penetrating the first insulating layer 141 may be formed. An uppermost first insulating layer, of a plurality of the first insulating layer 141 disposed on different levels, may cover side surfaces and a lower surface of the pattern layer 111. The uppermost first insulating layer, of the plurality of the first insulating layer 141 positioned on different levels, may cover side surfaces and lower surfaces of the connection pad 120P. The first redistribution layer 142 may be physically and electrically connected to the pattern layer 111 and the connection pad 120P by a first redistribution via 143 penetrating the uppermost first insulating layer 141. The first insulating layer 141 may include a PID, and a via hole may be formed by a photolithography process. The first redistribution layer 142 and the first redistribution via 143 may be formed through a plating process. The first redistribution structure 140 including the plurality of the first insulating layer 141, the plurality of the first redistribution layer 142, and the plurality of the first redistribution via 143 may be formed by repeating a photolithography process and a plating process.

A second redistribution structure 150 including a second redistribution layer 152 and a second redistribution via 153 may be formed on the upper surface of the encapsulant 130. A via hole of the second redistribution via 153 may be formed using a laser drill, or may be formed by a photolithography process when the encapsulant 130 includes a PID. The second redistribution layer 152 and the second redistribution via 153 may be formed through a plating process. The order of forming the first redistribution structure 140 and the second redistribution structure 150 is not limited to any particular example, and the second redistribution structure 150 may be preferentially formed before the tape carrier 10 is removed.

A first passivation layer 160a and a second passivation layer 160b having a first opening 160Ha and a second opening 160Hb may be formed on the first redistribution structure 140 and the second redistribution structure 150, respectively. The first opening 160Ha may expose a portion of the first redistribution layer 142. The second opening 160Hb may expose a portion of the second redistribution layer 152.

The pattern layer 111 embedded in the first insulating layer 141 of the first redistribution structure 140 may be disposed on substantially the same level as a level of the connection pad 120P of the semiconductor chip 120. The pattern layer 111 may redistribute the connection pad 120P along with the first redistribution layer 142. The pattern layer 111 may be formed to be in close contact with the lower surface of the barrier layer 112 by etching the metal plate. As the pattern layer 111 is disposed on a level higher than a level of the first redistribution layer 142, congestion of the first redistribution layer 142 may be reduced, and accordingly, design flexibility of the first redistribution layer 142 may improve.

Figure 6A:
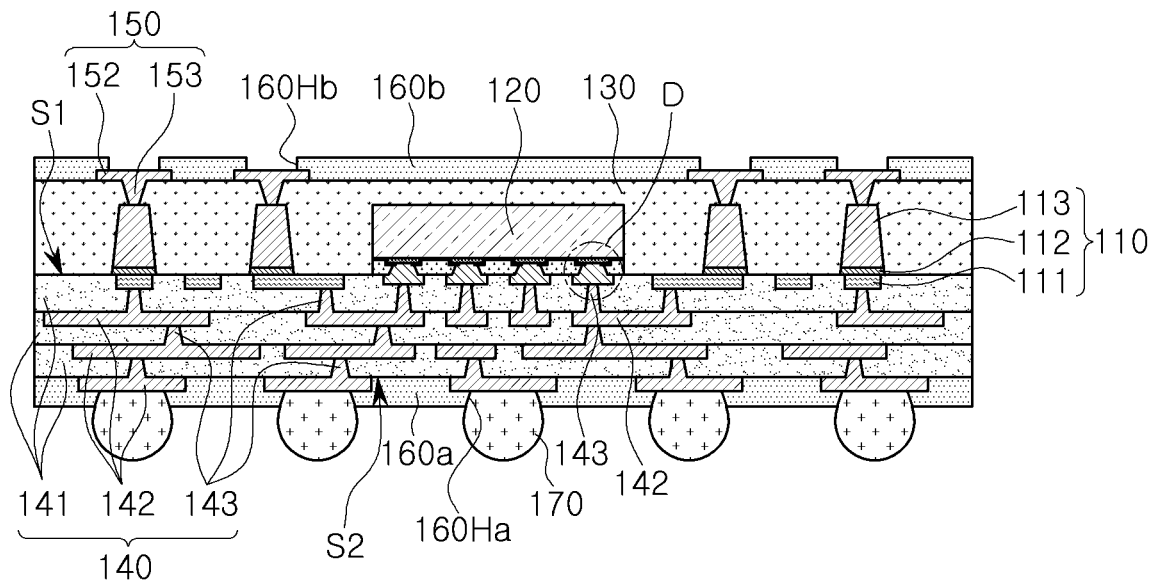
FIG. 6A is a cross-sectional diagram illustrating a semiconductor package according to an example embodiment of the present disclosure.
Figure 6B:
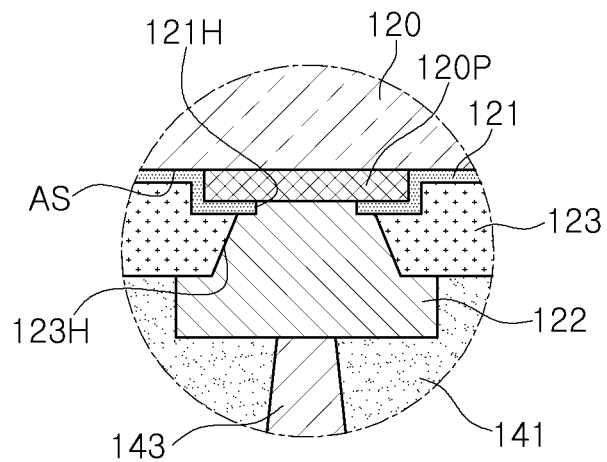
FIG. 6B is a cross-sectional diagram illustrating a region "D" illustrated in FIG. 6A according to an example embodiment of the present disclosure.

FIG. 6A is a cross-sectional diagram illustrating a semiconductor package 100b according to an example embodiment. FIG. 6B is a cross-sectional diagram illustrating a region "D" illustrated in FIG. 6A.

Referring to FIGS. 6A-B, in the semiconductor package 100b, the semiconductor chip 120 has an active surface AS on which the connection pad 120P is disposed, and may further include a first protective layer 121 disposed on the active surface AS and covering the connection pad 120P, a second protective layer 123 disposed on the first protective layer 121, and a connection post 122 penetrating the first protective layer 121 and the second protective layer 123 and electrically connected to the connection pad 120P. In the example embodiment, at least a portion of the connection post 122 may be embedded in the first insulating layer 141 of the first redistribution structure 140. The active surface AS and the first protective layer 121 of the semiconductor chip 120 may be spaced apart from a first surface S1 of a first redistribution structure 140, and a lower surface of the second protective layer 123 may be in contact with the first surface S1 of the first redistribution structure 140. A lower surface of the second protective layer 123 may be substantially coplanar with a lower surface of an encapsulant 130.

The first protective layer 121 and the second protective layer 123 may include an insulating material. The first protective layer 121 and the second protective layer 123 may include different materials. For example, the first protective layer 121 may include a silicon oxide layer or a silicon nitride layer, and the second protective layer 123 may include a photosensitive polyimide (PSPI). The connection post 122 may include a metal material. The connection post 122 may be formed by plating a first through-hole 121H of the first protective layer 121 and a second through-hole 123H of the second protective layer 123 using a metal material. A lower surface of the connection post 122 may have a curved shape corresponding to the first through-hole 121H and the second through-hole 123H.

Figure 7:
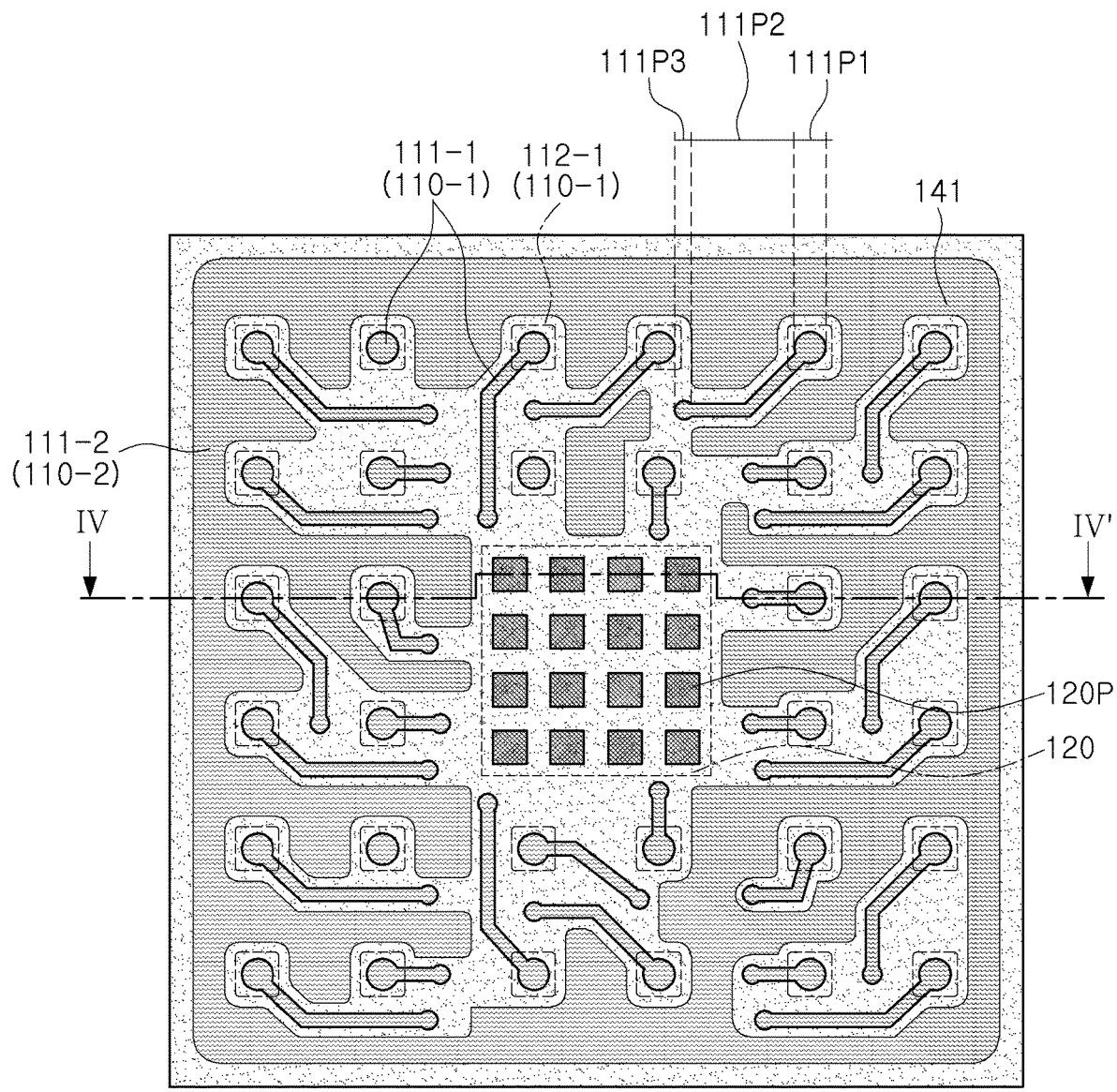
FIG. 7 is a plan diagram illustrating a semiconductor package according to an example embodiment of the present disclosure.
Figure 8:
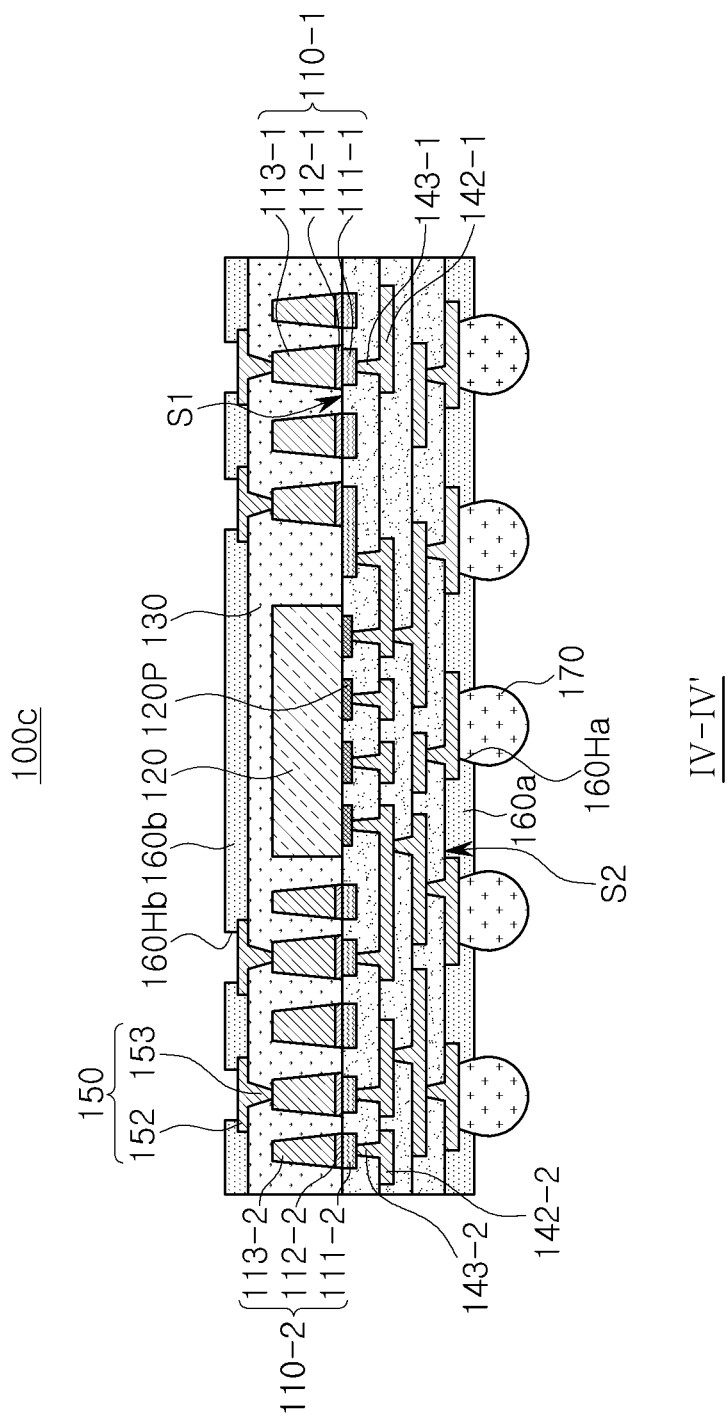
FIG. 8 is a cross-sectional diagram illustrating the semiconductor package illustrated in FIG. 7 taken along line IV-IV'.

FIG. 7 is a plan diagram illustrating a semiconductor package 100c according to an example embodiment. FIG. 8 is a cross-sectional diagram illustrating the semiconductor package illustrated in FIG. 7 taken along line IV-IV'.

Referring to FIGS. 7 and 8, the semiconductor package 100c may further include a core structure 110-2 disposed adjacent to a vertical connection structure 110-1 on a first surface S1 of a first redistribution structure 140 may be further included. The core structure 110-2 may be spaced apart from the semiconductor chip 120 and the vertical connection structure 110-1.

The core structure 110-2 may be formed by additionally patterning the first etching resist PR1 and the second etching resist PR2 in the manufacturing method described with reference to FIGS. 5A to 5E described above. Accordingly, the core structure 110-2 may include a first core layer 111-2 embedded in the first insulating layer 141, a second core layer 112-2 disposed on the first core layer 111-2, and a third core layer 113-2 disposed on the second core layer 112-2. A thickness of the first core layer 111-2 may be substantially the same as a thickness of the pattern layer 111-1, a thickness of the second core layer 112-2 may be substantially the same as a thickness of the barrier layer 112-1, and a thickness of the third core layer 113-2 may be substantially the same as a thickness of the pillar layer 113-1. The first core layer 111-2 may include the same material as a material of the pattern layer 111-1, the second core layer 112-2 may include the same material as a material of the barrier layer 112-1, and the third core layer 113-2 may include the same material as a material of the pillar layer 113-1. Differently from the pattern layer 111-1 of the vertical connection structure 110-1, as the first core layer 111-2 of the core structure 110-2 does not need patterning, the second core layer 112-2 may have a planar shape overlapping the first core layer 111-2.

The core structure 110-2 may be electrically connected to the first redistribution layer 142, and may be electrically insulated from the vertical connection structure 110-1. The core structure 110-2 may be connected to the ground pattern 142-2 and the ground via 143-2 of the first redistribution structure 140. The vertical connection structure 110-1 may be connected to the signal/power pattern 142-1 and the signal/power via 143-1 of the first redistribution structure 140. Similarly to the vertical connection structure 110-1, the core structure 110-2 may have various vertical/horizontal cross-sectional shapes. As the core structure 110-2 is formed in the same process as the process for forming the vertical connection structure 110-1, additional processes may be reduced. Also, rigidity, warpage properties, and heat dissipation properties of the semiconductor package 100c may improve.

Figure 9:
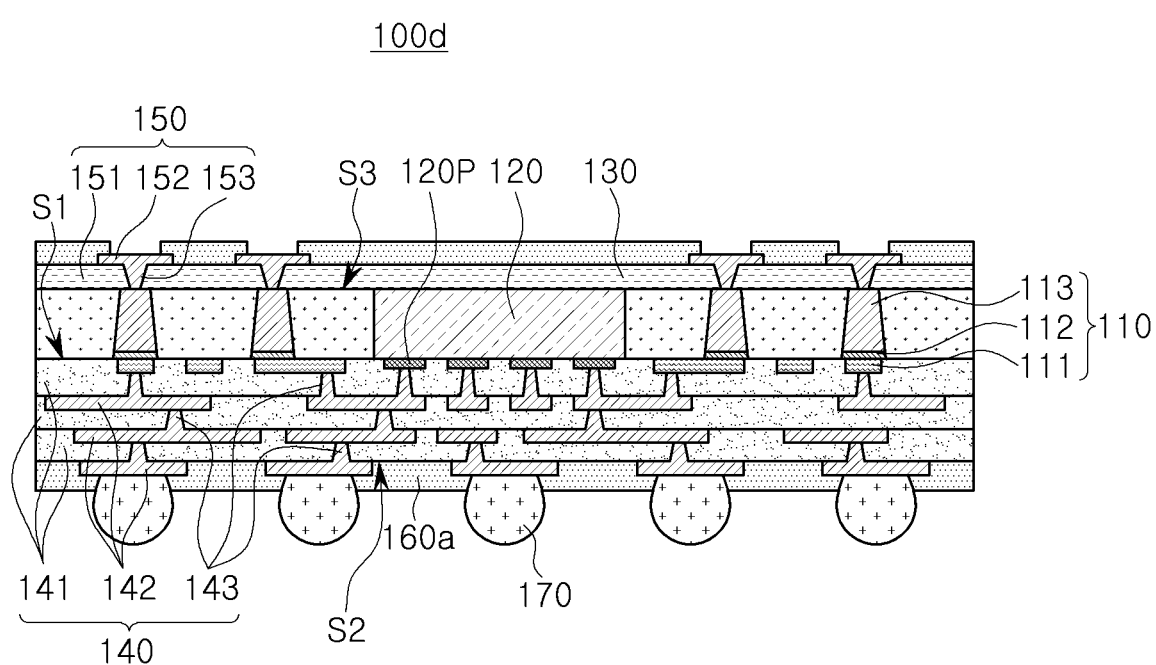
FIG. 9 is a cross-sectional diagram illustrating the semiconductor package according to an example embodiment of the present disclosure.

FIG. 9 is a cross-sectional diagram illustrating a semiconductor package 100d according to an example embodiment.

Referring to FIG. 9, the semiconductor package 100d may include a second redistribution structure 150 further including a second insulating layer 151 disposed on the encapsulant 130. In an example embodiment, the second redistribution structure 150 may include a second insulating layer 151 disposed on an encapsulant 130, a second redistribution layer 152 disposed on an upper surface of the second insulating layer 151, and a second redistribution via 153 penetrating the second insulating layer 151 and electrically connecting the second redistribution layer 152 to the vertical connection structure 110.

The second insulating layer 151 may be formed on a flat surface S3 including an upper surface of the encapsulant 130, an upper surface of the vertical connection structure 110, and an upper surface of the semiconductor chip 120. The flat surface S3 may be formed by exposing an upper surface of the vertical connection structure 110 and an upper surface of the semiconductor chip 120 by performing a planarization process after a process of forming the encapsulant 130 illustrated in FIG. 5F. An upper portion of the semiconductor chip 120 may be partially removed by the planarization process. The second insulating layer 151 may include an insulating material such as PID, but the material is not limited thereto.

Figure 10:
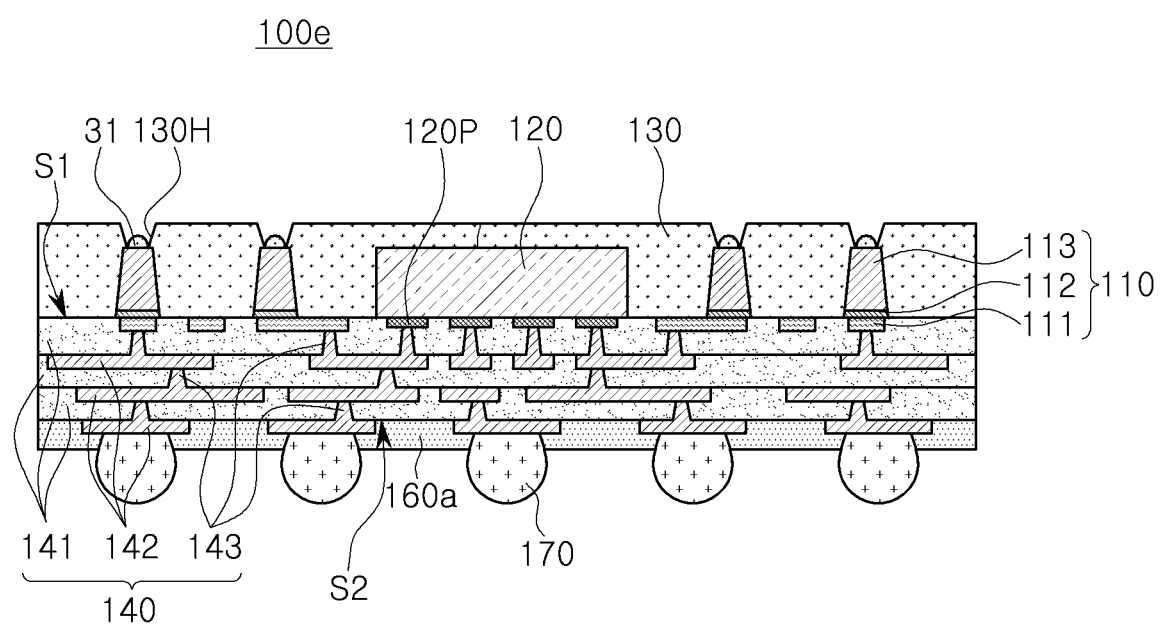
FIG. 10 is a cross-sectional diagram illustrating a semiconductor package according to an example embodiment of the present disclosure.

FIG. 10 is a cross-sectional diagram illustrating a semiconductor package 100e according to an example embodiment.

Referring to FIG. 10, in the semiconductor package 100e, an encapsulant 130 may have an opening 130H for exposing at least a portion of an upper surface of a vertical connection structure 110, and the connection member 31 may be disposed on the upper surface of the vertical connection structure 110 exposed through the opening 130H. The connection member 31 may include a material different from a material of the vertical connection structure 110. For example, the connection member 31 may include a solder ball.

Figure 11:
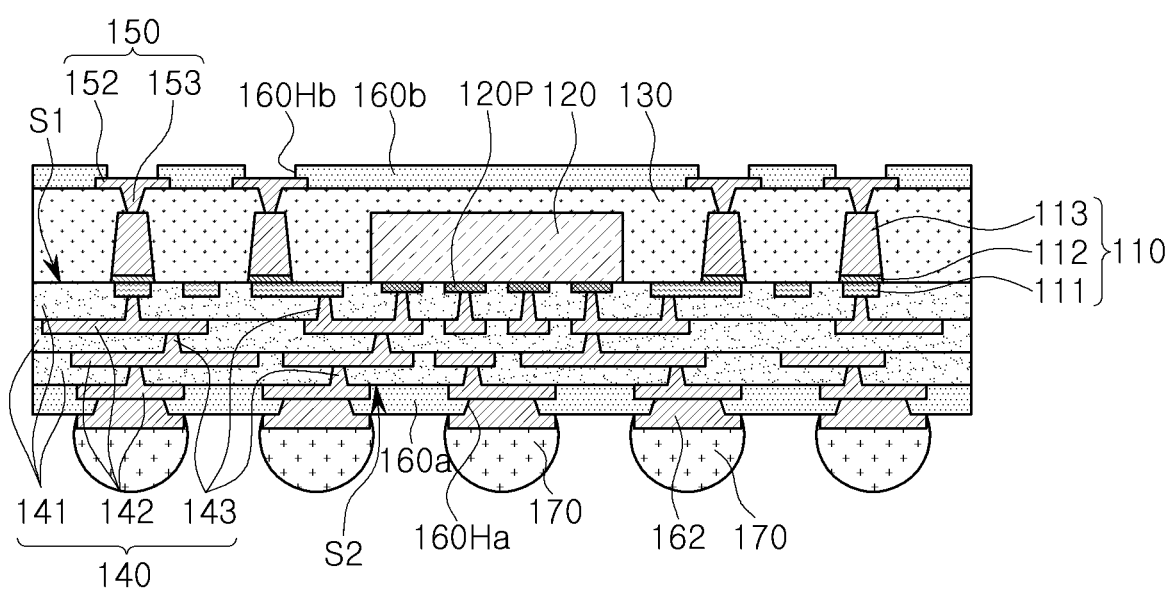
FIG. 11 is a cross-sectional diagram illustrating a semiconductor package according to an example embodiment of the present disclosure.

FIG. 11 is a cross-sectional diagram illustrating a semiconductor package 100f according to an example embodiment.

Referring to FIG. 11, the semiconductor package 100f may further include an under bump metal 162 disposed on a second surface S2 of a first redistribution structure 140. The under bump metal 162 may be disposed in an opening 160Ha of a first passivation layer 160a and may be electrically connected to a portion of the first redistribution layer 142 exposed by the opening 160Ha of the first passivation layer 160a. The under bump metal 132 may improve connection reliability of the connection bump 170 and board level reliability of the package 100f. The under bump metal 162 may be formed by a metallization method using a metal, but an example embodiment thereof is not limited thereto.

Figure 12:
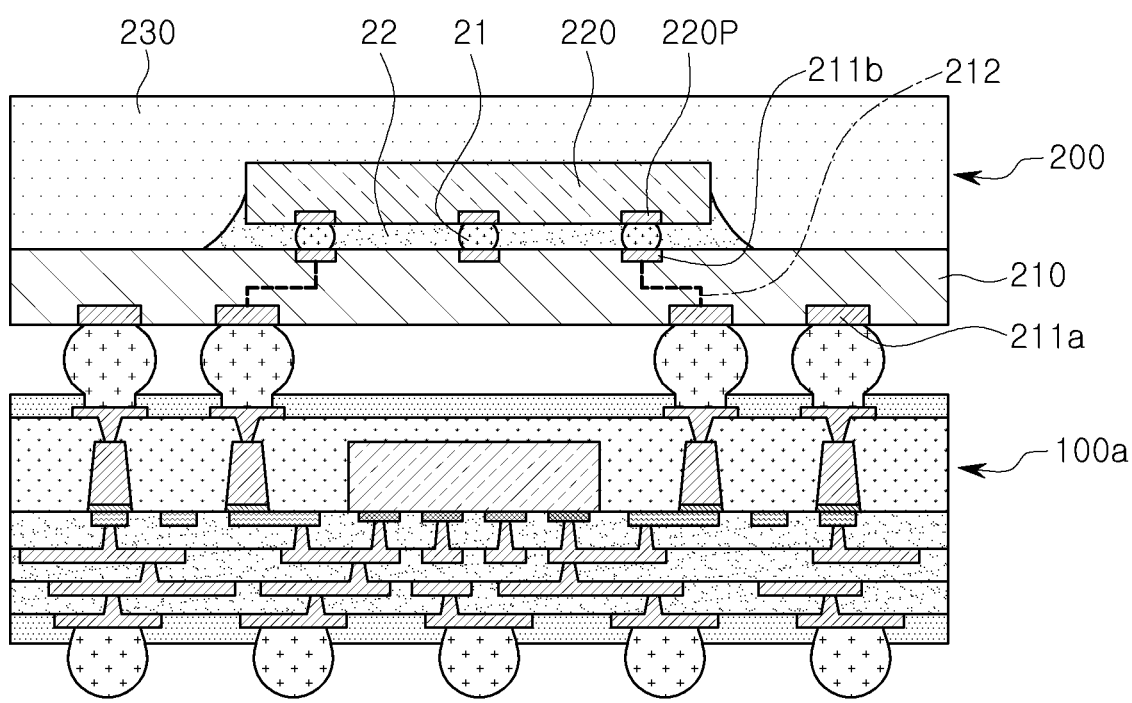
FIG. 12 is a cross-sectional diagram illustrating a semiconductor package according to an example embodiment of the present disclosure.
Figure 13:
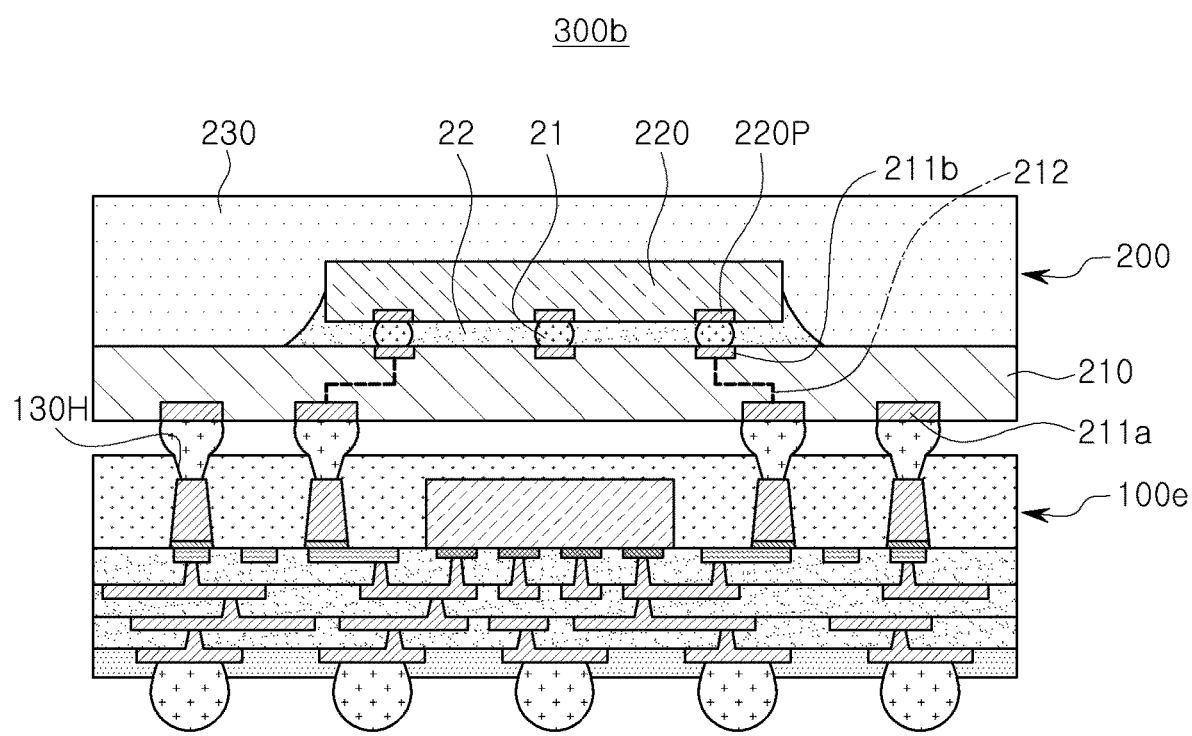
FIG. 13 is a cross-sectional diagram illustrating a semiconductor package according to an example embodiment of the present disclosure.

FIGS. 12 and 13 are cross-sectional diagrams illustrating semiconductor package 300a and 300b, respectively, according to an example embodiment.

Referring to FIG. 12, the semiconductor package 300a may have a package-on-package structure in which the second package 200 may be coupled onto the semiconductor package 100a illustrated in FIG. 1. The second package 200 may include a second redistribution substrate 210, a second semiconductor chip 220, and a second encapsulant 230.

The second redistribution substrate 210 may include redistribution pads 211a and 211b which may be electrically connected to an example entity on a lower surface and an upper surface thereof, respectively, and may include a redistribution circuit 212 connected to a redistribution pad 211a and a redistribution pad 211b therein. The redistribution circuit 212 may redistribute the connection pad 220P of the second semiconductor chip 220 to a fan-out region.

The second semiconductor chip 220 may include a connection pad 220P connected to an internal integrated circuit, and the connection pad 220P may be electrically connected to the second redistribution substrate 210 by a metal bump 21 The metal bump 21 may be surrounded by an underfill material 22. The underfill material 22 may be an insulating material including an epoxy resin, or the like. The metal bump 21 may include a solder ball or a copper pillar. In the modified example, the connection pad 220P of the second semiconductor chip 220 may directly in contact with the upper surface of the second redistribution substrate 210, and may be electrically connected to the redistribution circuit 212 through a via disposed in the second redistribution substrate 210.

A second encapsulant 230 may include a material the same as or similar to a material of the encapsulant 130 of the semiconductor package 100a. The second package 200 may be physically and electrically connected to the semiconductor package 100a by a connection bump 301. The connection bump 301 may be electrically connected to the redistribution circuit 212 disposed in the second redistribution substrate 210 through the redistribution pad 211a on the lower surface of the second redistribution substrate 210. The connection bump 301 may be formed of a low melting point metal, such as tin (Sn) or an alloy including tin (Sn), for example.

Referring to FIG. 13, differently from the semiconductor package 300a illustrated in FIG. 12, the semiconductor package 300b may have a package-on-package structure in which the second package 200 may be coupled onto the semiconductor package 100e illustrated in FIG. 10. In an example embodiment, the connection bump 301 disposed below the second package 200 may be connected to the vertical connection structure 110 through the opening 130H of the encapsulant 130. In an example embodiment, the first package 100e may be combined to the second package 200 without the second redistribution structure 150, and the connection member 31 of the first package 100e illustrated in FIG. 10 may be integrated with the connection bump 301.

According to the aforementioned example embodiments, a semiconductor package in which the redistribution layer has design flexibility and a method of manufacturing the semiconductor package may be provided.

While the example embodiments have been shown and described above, it will be apparent to those skilled in the art that modifications and variations could be made without departing from the scope of the present disclosure.

What is claimed is:
1. A semiconductor package, comprising:
a first redistribution structure having a first surface and a second surface opposing the first surface, and including a first insulating layer and a first redistribution layer disposed in the first insulating layer;
a semiconductor chip disposed on the first surface of the first redistribution structure, and including a connection pad electrically connected to the first redistribution layer and embedded in the first insulating layer;
a vertical connection structure disposed on the first surface of the first redistribution structure and electrically connected to the first redistribution layer;
an encapsulant encapsulating at least a portion of each of the semiconductor chip and the vertical connection structure;

a second redistribution structure disposed on the encapsulant and including a second redistribution layer electrically connected to the vertical connection structure; and a connection bump disposed on the second surface of the first redistribution structure and electrically connected to the first redistribution layer, wherein the vertical connection structure includes a pattern layer embedded in the first insulating layer, a barrier layer disposed on the pattern layer, and a pillar layer disposed on the barrier layer, wherein the semiconductor chip has a bottom surface on which the connection pad is disposed, wherein the first insulating layer contacts a lower surface and a side surface of the connection pad, a lower surface and a side surface of the pattern layer, and the bottom surface of the semiconductor chip, wherein the pattern layer overlaps the barrier layer in a vertical direction and the connection pad in a horizontal direction perpendicular to the vertical direction, and wherein an uppermost width of the barrier layer in the horizontal direction is equal to or less than a lowermost width of the pillar layer in the horizontal direction.

2. The semiconductor package of claim 1,
wherein a thickness of the pillar layer is greater than a thickness of the pattern layer and a thickness of the barrier layer, and
wherein the thickness of the pattern layer is greater than the thickness of the barrier layer.

3. The semiconductor package of claim 2,
wherein the thickness of the pillar layer is within a range of 100 μm to 200 μm,
wherein the thickness of the barrier layer is within a range of 1 μm to 2 μm, and
wherein the thickness of the pattern layer is within a range of 5 μm to 10 μm.

4. The semiconductor package of claim 1, wherein the barrier layer includes a material different from materials of the pillar layer and the pattern layer.

5. The semiconductor package of claim 4,
wherein the barrier layer includes nickel (Ni) or titanium (Ti), and
wherein the pillar layer and the pattern layer include copper (Cu).

6. The semiconductor package of claim 1, wherein at least a portion of an upper surface of the pattern layer is exposed from the first insulating layer.

7. The semiconductor package of claim 1, wherein the encapsulant covers at least a portion of each of a side surface of the pillar layer, a side surface of the barrier layer, and an upper surface of the pattern layer.

8. The semiconductor package of claim 1, wherein a lower surface of the encapsulant is coplanar with a lower surface of the barrier layer.

9. The semiconductor package of claim 1, wherein the pillar layer has a vertical cross-sectional shape of which a side surface is tapered, such that a width of the pillar layer increases towards the barrier layer.

10. The semiconductor package of claim 1, further comprising:
a core structure disposed adjacent to the vertical connection structure on the first surface of the first redistribution structure,
wherein the core structure includes a first core layer embedded in the first insulating layer, a second core layer disposed on the first core layer, and a third core layer disposed on the second core layer,
wherein a thickness of the first core layer is the same as a thickness of the pattern layer,
wherein a thickness of the second core layer is the same as a thickness of the barrier layer, and
wherein a thickness of the third core layer is the same as a thickness of the pillar layer.

11. The semiconductor package of claim 10, wherein the core structure is electrically insulated from the vertical connection structure.

12. The semiconductor package of claim 1,
wherein the second redistribution structure further includes a second insulating layer disposed on the encapsulant, and a second redistribution via penetrating the second insulating layer and electrically connecting the second redistribution layer to the vertical connection structure, and
wherein the second redistribution layer is disposed on an upper surface of the second insulating layer.

13. A semiconductor package, comprising:
a redistribution structure including an insulating layer and a redistribution layer disposed on the insulating layer;
a semiconductor chip disposed on the redistribution structure and including a connection pad electrically connected to the redistribution layer, the connection pad embedded in a first surface of the insulating layer, opposite to a second surface of the insulating layer on which the redistribution layer is disposed; and
a vertical connection structure surrounding the semiconductor chip and electrically connected to the redistribution layer on the redistribution structure,
wherein the vertical connection structure includes a pattern layer comprising segments embedded in the first surface, a barrier layer disposed on the pattern layer, and a pillar layer disposed on the barrier layer,
wherein the segments have a first pad portion in contact with a lower surface of the barrier layer and overlapping the pillar layer in a vertical direction, a second pad portion spaced apart from the first pad portion, and a pattern portion extending from the first pad portion to the second pad portion in a horizontal direction,
wherein a thickness of the barrier layer in the vertical direction is less than a thickness of the pattern layer in the vertical direction,
wherein a length of the barrier layer in the horizontal direction is less than a total length of at least one of the segments of the pattern layer in the horizontal direction,
wherein a bottom surface of the semiconductor chip contacts with the first surface of the insulating layer,
wherein the connection pad and the pattern layer are at a level below the first surface of the insulating layer in the vertical direction,
wherein the barrier layer is at a level above the first surface of the insulating layer in the vertical direction, and
wherein the pattern layer overlaps the connection pad in the horizontal direction.

14. The semiconductor package of claim 13,
wherein the pattern portion has a lane shape that connects the first pad portion to the second pad portion, and
wherein at least a portion of the pattern portion is in contact with the lower surface of the barrier layer.

15. The semiconductor package of claim 13, wherein the first pad portion has a shape extending from one end of the pattern portion with a same line width as a line width of the pattern portion.

16. The semiconductor package of claim 13,
wherein the semiconductor chip has an active surface on which the connection pad is disposed, and further includes a first protective layer disposed on the active surface and covering the connection pad, a second protective layer disposed on the first protective layer, and a connection post penetrating the first protective layer and the second protective layer and electrically connected to the connection pad, and wherein at least a portion of the connection post is embedded in the insulating layer of the redistribution structure.

17. The semiconductor package of claim 13, further comprising:
an encapsulant encapsulating at least a portion of each of the semiconductor chip and the vertical connection structure, and having an opening for exposing at least a portion of an upper surface of the vertical connection structure; and
a connection member disposed on the portion of the upper surface of the vertical connection structure that is exposed through the opening,
wherein the connection member includes a material different from a material of the vertical connection structure.

18. A semiconductor package, comprising:
a redistribution structure including an insulating layer and a redistribution layer disposed on the insulating layer;
a semiconductor chip disposed on the redistribution structure and including a connection pad electrically connected to the redistribution layer, the connection pad disposed on a bottom surface of the semiconductor chip;
a vertical connection structure disposed on the redistribution structure and surrounding the semiconductor chip; and
an encapsulant encapsulating at least a portion of each of the semiconductor chip and the vertical connection structure,
wherein the vertical connection structure includes a pattern layer embedded in the insulating layer, a barrier layer disposed on the pattern layer, and a pillar layer disposed on the barrier layer,
wherein at least a portion of an upper surface of the pattern layer is in contact with the encapsulant,
wherein at least a portion of each of a side surface and a lower surface of the pattern layer is in contact with the insulating layer,
wherein the bottom surface of the semiconductor chip, a lower surface of the connection pad, and a side surface of the connection pad are in contact with the insulating layer,
wherein the redistribution structure further includes a first redistribution via penetrating the insulating layer, that is in contact with the lower surface of the pattern layer, and connecting the redistribution layer to the pattern layer,
wherein a thickness of the pillar layer is greater than a thickness of the pattern layer and a thickness of the barrier layer, and
wherein the thickness of the pattern layer is greater than the thickness of the barrier layer.

19. The semiconductor package of claim 18,
wherein the redistribution layer includes a signal pattern, a power pattern, and a ground pattern, and
wherein the pattern layer is connected to at least one from among the signal pattern and the power pattern through the first redistribution via.

20. The semiconductor package of claim 19, further comprising:
a core structure disposed adjacent to the vertical connection structure and electrically connected to the redistribution layer through a second redistribution via of the redistribution structure,
wherein the core structure includes a first core layer embedded in the insulating layer, a second core layer disposed on the first core layer, and a third core layer disposed on the second core layer, and
wherein the first core layer is connected to the ground pattern through the second redistribution via.

* * * * *